United States Patent [19]

Swarbrick et al.

[11] Patent Number: 5,500,604
[45] Date of Patent: Mar. 19, 1996

[54] RADIAL TENSIONING LAMINATION FIXTURE FOR MEMBRANE TEST PROBE

[75] Inventors: David B. Swarbrick, Mission Viejo; Jack H. Pike, Dana Point, both of Calif.

[73] Assignee: Hughes Aircraft Company, Los Angeles, Calif.

[21] Appl. No.: 275,480

[22] Filed: Jul. 15, 1994

[51] Int. Cl.$^6$ .................................................. G01R 31/02
[52] U.S. Cl. .......................... 324/754; 324/758; 156/160; 156/229
[58] Field of Search ................................. 324/754, 758; 29/448, 848; 156/160, 163, 229, 580, 583.1, 73.3; 445/68, 30

[56] References Cited

U.S. PATENT DOCUMENTS

| | | | |
|---|---|---|---|
| Re. 34,765 | 3/1988 | Alexander et al. | 156/160 |
| 4,721,488 | 1/1988 | Dougherty et al. | 445/30 |
| 4,918,383 | 4/1990 | Huff et al. | 324/754 |
| 5,148,103 | 9/1992 | Pasiecznik, Jr. | |
| 5,180,977 | 1/1993 | Huff | 324/754 |
| 5,183,426 | 2/1993 | Ho-Jin et al. | 445/68 |
| 5,264,787 | 11/1993 | Woith et al. | |
| 5,355,079 | 10/1994 | Evans et al. | 324/754 |
| 5,393,360 | 2/1995 | Bridges et al. | 156/73.3 |

Primary Examiner—Kenneth A. Wieder
Assistant Examiner—Kourosh Cyrus Khosravi
Attorney, Agent, or Firm—Elizabeth E. Leitereg; Terje Gudmestad; W. K. Denson-Low

[57] ABSTRACT

A membrane test probe (10) for use in testing integrated circuit chips (50) has a thin flexible membrane (30) bearing test contacts (40,42) that is stretched across an opening of a rigid-flex substrate (12). The membrane is manufactured with uniform radial tension by a lamination fixture having a steel pressure plate (76) that includes an annular groove (78). A high temperature O-ring (80) is positioned in the groove against the radially inner wall (82) of the groove with the radially outer wall of the groove being displaced from the outer part of the O-ring. The O-ring has a thickness greater than the depth of the groove and when the steel pressure plate is pressed against the membrane to press it against its substrate the O-ring pushes a portion (92) of the membrane into a shallow groove (16) in the substrate and deforms radially outwardly. As the O-ring deforms radially outwardly, it exerts a radially outwardly directed tension on the membrane which is cured in this radially stretched condition.

18 Claims, 2 Drawing Sheets

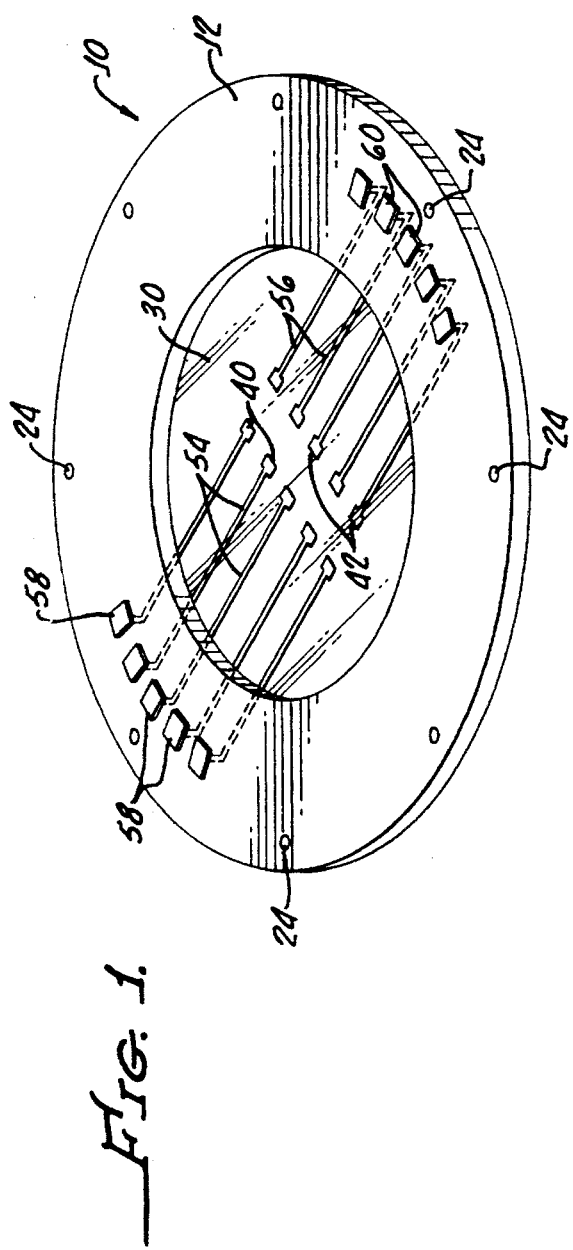
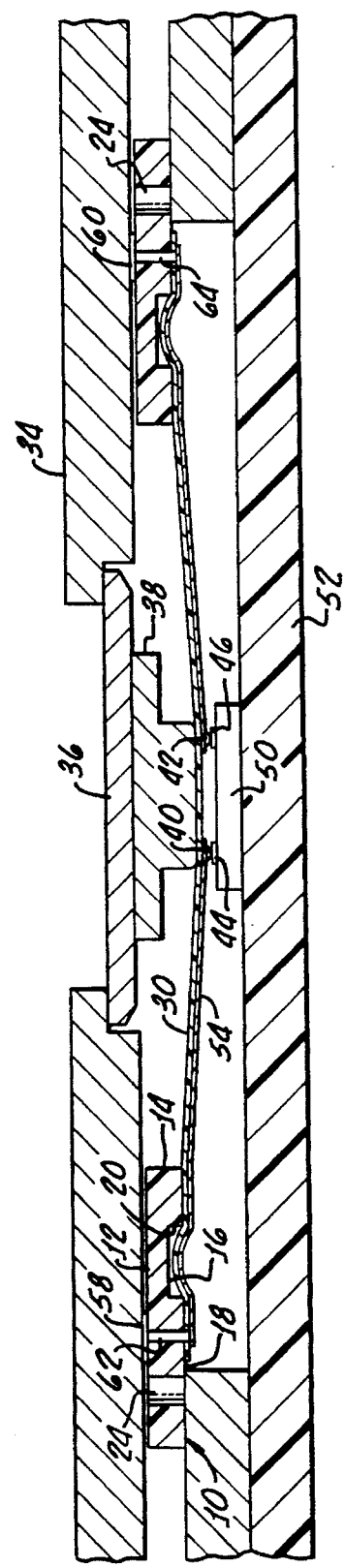

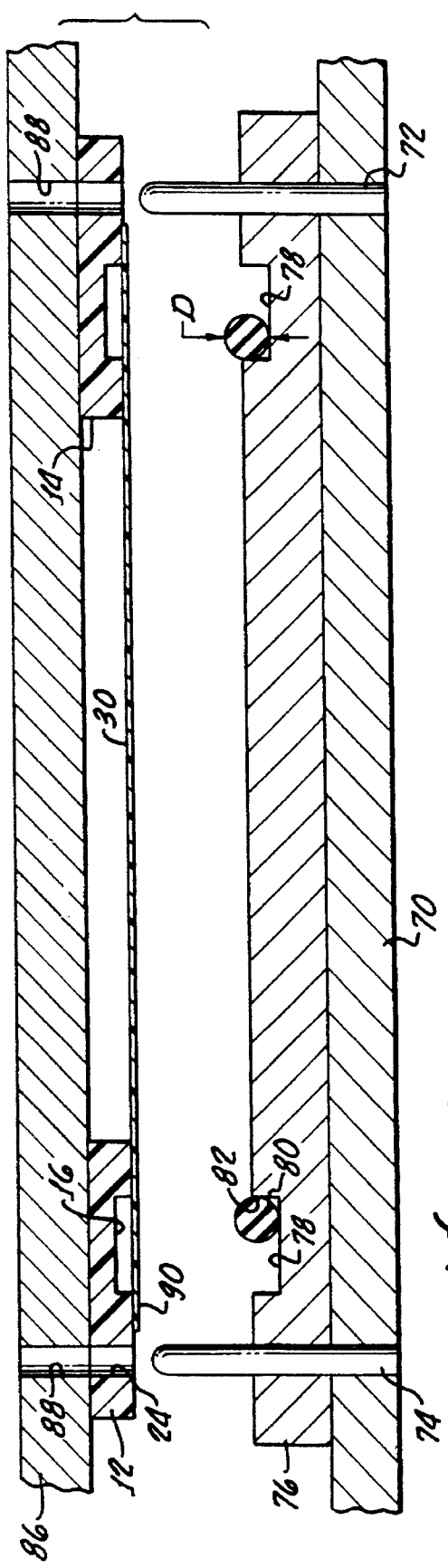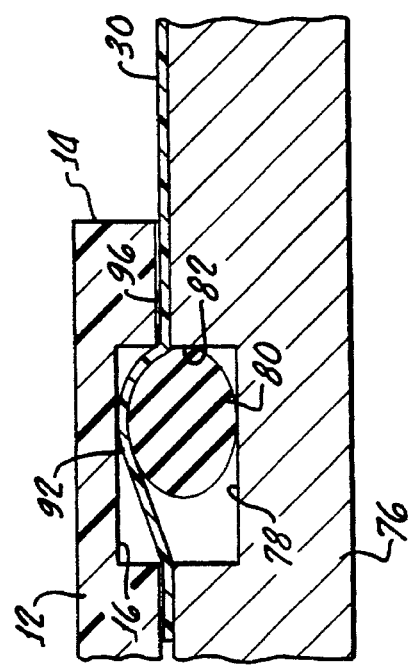

RADIAL TENSIONING LAMINATION FIXTURE FOR MEMBRANE TEST PROBE

BACKGROUND OF THE INVENTION

1. Field of the Invention

The present invention relates to manufacture of membrane test probes used in testing of integrated circuit chips, and more particularly concerns a method for tensioning the membrane of a test probe.

2. Description of Related Art

Testing of an integrated circuit chip generally involves application of various test signals to the chip and observation of resulting signals produced by the chip. Such testing is often performed before the chip is assembled into its final circuit configuration, and even while the chip is still on a wafer bearing a number of chips that have yet to be severed from one another. Various types of probe arrangements have been devised to enable electrical connection between test circuitry of a test fixture and the chip contact pads. One such probe arrangement which exhibits a number of significant advantages comprises a membrane test probe wherein a thin flexible membrane is stretched across the central opening of a rigid-flex substrate. A number of test contacts are formed on one surface of the central portion of the membrane and project outwardly therefrom. These test contacts are connected by circuit traces on the surface of the membrane to peripheral portions of the membrane and thence to test circuitry. The membrane test probe is placed adjacent the chip to be tested with its projecting test contacts in registration with contact pads of a chip to be tested. Pressure is applied to the remote face of the membrane so as to effectively push the membrane outwardly toward the chip and force its test contacts against the chip contacts. A membrane test probe of this type is shown in U.S. Pat. No. 5,264,787 for RIGID-FLEX CIRCUITS WITH RAISED FEATURES AS IC TEST PROBES by Blake F. Woith, William R. Crumly and Jacques F. Linder, and U.S. Pat. No. 5,148,103 for APPARATUS FOR TESTING INTEGRATED CIRCUITS, by J. Pasiecznik. Both of these patents are assigned to the assignee of the present invention.

When the test membrane is pressed against the integrated circuit chip, the testing pressure exerted on the membrane may cause the membrane to be distorted and effectively to exhibit a drape wherein parts of the very thin flexible membrane tend to bend over and around contact pads of the chip. This drape creates undesirable stresses on the thin circuit traces and may possibly cause undesired contact between membrane circuit traces and the chip surface. Excessive drape may tend to misalign test probe contacts and chip contacts. To minimize this drape, it has been suggested to provide different types of pressure backup blocks at the back of the membrane, some with particular surface configurations. Axial pressure is provided behind the membrane by means of a backup plate or pressurized gas, so as to distend the membrane and create radial tension therein during testing that would tend to overcome such a drape. The use of such devices for overcoming drape during conduct of a test procedure is difficult, adds to the complexity of the arrangement and is unreliable. Precise repeatability of the test conditions becomes difficult to obtain. Yet there is still insufficient assurance that the undesired drape of a membrane is uniformly eliminated.

Accordingly, it is an object of the present invention to provide a test probe membrane that avoids or minimizes the above-mentioned problems.

SUMMARY OF THE INVENTION

In carrying out principles of the present invention in accordance with a preferred embodiment thereof, a flexible test probe membrane is laminated to a substrate having an annular securing section encircling a substrate opening wherein the membrane spans the opening. One embodiment of the method provides a rigid pressure plate, positions the membrane on the substrate with an inner portion of the membrane spanning the opening and radially outer portions of the membrane adjacent to the substrate. The pressure plate is pressed against the membrane and substrate with the membrane between the substrate and pressure plate. Pressure of the pressure plate against the membrane and substrate is caused to apply radially outwardly directed tension to membrane while the membrane and its adhesive bonding are cured. In a specific embodiment the pressure plate is provided with a wide annular groove having a deformable O-ring, thicker than the depth of the groove, positioned adjacent an inner wall of the groove, whereby upon pressing the pressure plate against the membrane and substrate the O-ring is deformed radially outwardly and displaces the membrane radially outwardly while the lamination fixture is subjected to heat to cure the membrane.

BRIEF DESCRIPTION OF THE DRAWINGS

In the accompanying drawings:

FIG. 1 is a partial sectional view of a membrane test probe made in accordance with principals of the present invention, in position for testing of an integrated circuit chip;

FIG. 2 is a pictorial illustration of the membrane test probe of FIG. 1;

FIG. 3 is a sectional view of a fixture for radially tensioning the membrane of the test probe; and FIG. 4 is an enlarged detailed fragmentary section showing operation of the deformable O-ring as it radially tensions the membrane.

DESCRIPTION OF THE PREFERRED EMBODIMENT

As shown in FIGS. 1 and 2 a membrane test probe 10 includes a circular rigid-flex substrate 12, formed of a thin relatively rigid dielectric material having a central opening 14 extending entirely through the substrate. Surrounding opening 14 is a groove 16 formed in a first face 18 of the rigid-flex substrate 12. The groove has a radially inner wall 20 positioned close to the wall of opening 14. A plurality of tool aligning pin holes 24 are formed in an outer section of the rigid-flex substrate for use in laminating procedures. The tooling pin aligning holes 24 and the groove 16 are provided for use in manufacturing of the membrane test probe as will be described below.

To the lower face (as seen in FIG. 1) of substrate 12 is secured a radially tensioned thin membrane 30 formed of a polyimide such as Kapton, for example, having an adhesive on one side that securely bonds the upper side of the membrane to the rigid-flex substrate 12. The membrane and substrate are mounted in a test fixture, part of which is shown at 34, and detachably connected to the fixture by any suitable means (not shown). The test fixture carries a glass plate 36 and a glass backup block 38 that presses against the back side of the membrane when used in a test procedure. If deemed necessary or desirable additional resilient spring members (not shown) may be employed to provide spring urged downward force against the back side of the membrane for use in during testing.

The membrane is formed with a plurality of test contacts, such as contacts 40,42 on its lower surface, arranged in a pattern that conforms to and mates with a pattern of chip contact pads 44,46 on a surface of a chip 50 carried on a suitable fixed support 52. A number of electrically conductive circuit traces 54,56 are formed on the lower surface of the membrane for connection of test contacts 40,42 to connectors 58,60 on the upper side of the rigid-flex substrate. The circuit traces 54,56 have radially outer most ends thereof connected to connecting pads 58,60 by means of vias 62,64 that extend through the rigid-flex substrate for connection between the membrane traces 54,56 and connectors 58,60. These connectors on the upper surface of the rigid-flex circuit connect to circuitry (not shown) on the test fixture 34 that in turns connects to other test circuitry of the fixture.

In use of the membrane test probe for testing an integrated circuit chip such as chip 50, the test probe is mounted to the test fixture 34 and positioned over a chip 50 carried on a support 52 with the test probe contacts 40,42 in close proximity to and registration with chip contact pads 44,46. Glass plate 36 and the transparent backup block 38 facilitate visual alignment of the test probe contacts with the chip pads. Pressure is applied (by means not shown) downwardly to the membrane to press the test probe contacts 40,42 against the chip pads and appropriate signals are transferred between the test circuitry and the chip.

The membrane 30 is illustrated in FIG. 1 in an outwardly bowed condition which it assumes under the pressure exerted by the backup of plate 38. The membrane normally, without being pressed by the backup plate 38, assumes a substantially planar configuration, stretching in a flat plane completely across the opening 14 of the rigid-flex substrate. It is able to assume such a flat planar configuration because of manufacturing methods to be described below that exert radially outward tensioning forces on the membrane as it is bonded to the substrate and cured.

FIG. 3 illustrates a tensioning lamination fixture employing principals of the present invention for simultaneously bonding the membrane to its substrate while simultaneously applying and maintaining a radially outwardly directed tension on the membrane.

The lamination fixture includes a steel caul plate or backup plate 70, fixedly carrying a plurality of alignment tooling pins 72,74 which may be twelve in number, extending in a circle around the periphery of the plate 70. The pins extend through appropriately positioned holes in a steel separator plate 76, which is mounted to the caul plate 70 and is formed with an annular groove 78 circling a central portion of plate 76. Positioned in the groove is a resilient deformable high temperature continuous or ring-shaped body such as an elastomeric O-ring 80 which has a normal, unstressed thickness or body diameter D that is considerably greater than the depth of groove 78. Moreover, the diameter D of the O-ring body is about one-half of the radial extent (width) of the groove 78. The inner diameter of the ring formed by the O-ring is substantially equal to the diameter of the inner wall 82 of the groove 78, so that the O-ring is positioned snugly against the inner wall 82 of groove 78.

The flexible polyimide membrane 30, in semi-cured form and having an adhesive coating on its upper surface, between the membrane and the substrate 12, is lightly adhesively secured to radially outer portions of the substrate such as at the annular outer portion 90 just inwardly of the circular array of tooling pin holes 24 formed in the rigid-flex substrate. This holds the membrane on the substrate until lamination pressure is applied by the lamination fixture. Thus the membrane 30, prior to the lamination procedure, is lightly secured at its outer periphery to an annular section 90 of the rigid-flex substrate, with the membrane effectively loosely extending across the opening 14 of the rigid-flex substrate. The membrane extends radially and completely across the groove 16 formed in substrate 12. Groove 16 is positioned in registration with the groove 78 of steel plate 76. An upper pressure plate 86 also having tooling pin holes 88 for reception of tooling pins 72,74 is employed in the fixture to press downwardly against the upper surface of rigid-flex substrate 12 to movie the rigid-flex substrate into direct face-to-face contact with the upper face of pressure plate 16. During this motion the tooling pins enter the alignment holes of the substrate and upper pressure plate to maintain alignment of the parts. Moreover during this motion the O-ring initially contacts a portion of the membrane close to the inner wall of the groove 16 in the rigid-flex substrate and presses this portion of the membrane inwardly into the groove 16. As the O-ring moves with the membrane portion into the groove 16, the O-ring is flattened and deforms by spreading radially outwardly. The O-ring deforms and spreads radially outwardly because it is constrained by the inner wall 82 of groove 78 in the plate 76 and cannot spread radially inwardly. As the O-ring spreads radially outwardly, its engagement with the membrane 30 causes the membrane to deform and slightly bend around the upper part of the O-ring. This bending of the membrane around the O-ring increases the effective frictional engagement between the O-ring and membrane. This causes the portion of the membrane within groove 16 to move radially outwardly with the O-ring. The combined depth of grooves 78 and 16 is less than the body diameter D of the O-ring to ensure deformation of the O-ring as it is forced into groove 16. Because the O-ring is a complete circular element, its radially outward deflection occurs over the entire circle of the O-ring and is uniform over the entire area of the O-ring. This provides a precisely uniform (through 360°) radial tensioning of the membrane during the lamination procedure.

FIG. 4 provides a somewhat schematic illustration of the deformation of both the O-ring and membrane that occurs during this lamination procedure. FIG. 4 illustrates the O-ring pressing against the membrane 30 and compressed between grooves 16,78. The membrane has a portion 92 that is pressed into the rigid-flex substrate groove 16 and slightly bends over the upper surface of the deforming O-ring. Deformation causes the O-ring to move radially outwardly (toward the left as illustrated in FIG. 4) frictionally dragging the membrane with it and, therefore, radially tensioning the membrane. The fixture is held in this mated condition (shown in FIG. 4) while heat is applied to the fixture and while the Kapton membrane and its adhesive are cured to fixedly secure the membrane to the substrate. The adhesive positioned between the membrane and the substrate, at areas generally indicated at 96 between the inner side of groove 16 and the opening 14, secures the radially outwardly stretched membrane to the substrate. Both adhesive and membrane are cured in this condition. Uniform tensioning is thus permanently imparted to the membrane probe as the heat and pressure cure stage of the lamination cycle occurs and the adhesive cures and binds the membrane under tension to the circular substrate. Therefore, upon removal of the membrane and substrate from the lamination fixture, by raising the upper pressure plate 86 and lifting the substrate and membrane from the tooling pins, the completed membrane and its supporting substrate are in finished configuration (the circuit traces and test contacts are affixed to the membrane prior to lamination to the substrate 12). Thus the membrane has a permanent planar configuration with a permanent radial tensioning that is uniformly exerted in all directions (360°).

By providing uniform tensioning in all directions, a uniform positioning of the test probe contacts is obtained when the membrane is pressed and displaced outwardly by the pressure on its back face exerted by the backup block 38. If the initial radial tension of the membrane were not uniform in all directions the outward displacement of the membrane, e.g. the bowing that is illustrated in FIG. 1 as occurring during testing procedure, might cause different ones of contacts 40,42 to move to different positions and thus precision and uniformity of engagement between test probe contacts 40,42 and chip contact pads 44,46 would be degraded. Without uniform radial tension of the membrane precision of such chip pad-to-probe contact connection might be less desirable and quite possibly result in a lack of appropriate electrical interconnection between the test probe and the chip.

What is claimed is:

1. In a membrane test probe having a flexible membrane that is used in testing integrated circuit chips, a method of laminating said flexible membrane to a probe substrate having an annular securing section encircling a substrate opening, wherein said membrane spans said opening, said method comprising the steps of:

providing a rigid pressure plate, positioning said membrane on said substrate with an inner portion of said membrane spanning said opening, and a radially outer portion of said membrane adjacent said substrate, pressing said rigid pressure plate against said membrane and substrate with said membrane between said substrate and pressure plate, causing the pressure of said pressure plate against said membrane to apply radially outwardly directed tension to said membrane, bonding said membrane to said substrate while the pressure of said pressure plate applies tension to said membrane, and removing said pressure plate from said membrane after said bonding.

2. The method of claim 1 wherein said bonding includes the steps of interposing an adhesive between said membrane and said substrate, and rigidifying said adhesive while said pressure plate is pressed against said membrane and substrate and before said pressure plate is removed.

3. The method of claim 1 wherein said step of causing pressure to apply radially outwardly directed tension comprises interposing a continuous circular body between said membrane and pressure plate, restraining radially inward displacement of said body, and including the step of removing said body with removal of said pressure plate.

4. The method of claim 3 including the step of forming an annular groove in said pressure plate, forming said body of resilient deformable material, and positioning said continuous circular body in said groove.

5. The method of claim 4 including the step of forming a substrate annular groove in said substrate surrounding said opening and in registration with said first mentioned annular groove, said step of pressing said rigid pressure plate comprising deforming said body in both of said annular grooves.

6. The method of claim 3 including the step of forming said continuous body as a deformable toroidal body with a thickness greater than the depth of said substrate annular groove.

7. The method of claim 6 including the steps of forming said toroidal body with a thickness substantially equal to the sum of the depths of said substrate annular groove and said first mentioned annular groove.

8. The method of claim 4 wherein said step of forming an annular groove in said pressure plate includes the step of forming an inner circumferential wall on said first mentioned groove and employing said wall to restrain radially inward motion of said body.

9. The method of claim 1 including the step of forming a plurality of electrically conducting circuit traces on said membrane having inner ends positioned at a central area of said membrane, and forming a plurality test probe contacts on said circuit trace inner ends projecting away from the surface of said membrane.

10. The method of claim 9 wherein said step of bonding includes the steps of interposing a bonding material between said membrane and said circuit traces and between said membrane and said substrate, and including the step of heating said membrane, bonding material and substrate while pressing said pressure plate against said membrane and substrate.

11. A method for testing an integrated circuit chip having chip contact pads comprising the steps of:

forming a plurality of electrical circuit traces on a thin flexible test membrane extending from radially inner ends of the traces at a central area of said membrane to radially outer ends at an outer section of the membrane, forming outwardly projecting probe test contacts on said radially inner ends, forming a substrate having an opening therein, temporarily securing radially outer sections of said membrane to said substrate to cause said membrane to span said opening with said central area positioned at the opening, providing a rigid pressure plate, pressing said pressure plate against said membrane and substrate with said membrane between said substrate and pressure plate, causing the pressure of said pressure plate against said membrane to apply radially outwardly directed tension to said membrane, applying heat to said pressure plate membrane and substrate to fix said membrane in said radially outwardly tensioned condition, removing said pressure plate, positioning said membrane and central area thereof adjacent an integrated circuit chip to be tested with said probe test pads in registration with said chip contact pads, and pressing said membrane outwardly to cause said test probe contacts to press against said chip contact pads.

12. The method of claim 11 wherein said step of causing the pressure of the pressure plate to apply radially outwardly directed tension comprises the steps of forming mutually registering annular grooves in said substrate and pressure plate, positioning a resilient O-ring at a radially inner side of the groove of said pressure plate, and forming said O-ring with a body diameter substantially equal to the sum of the depths of said grooves.

13. A method for manufacturing a radially tensioned flexible membrane test probe for use with a test fixture in the testing of integrated circuit chips, wherein said test probe includes a substrate having a central opening and a radially tensioned flexible membrane spanning said opening and secured to the substrate at the periphery of said opening, said membrane having a plurality of test contacts projecting from one surface thereof and a plurality of circuit traces connecting respective ones of said test contacts to connecting pads at the periphery of said opening whereby an integrated circuit chip may be tested by applying pressure to the other surface of said membrane to move a central section of the radially tensioned flexible membrane outwardly and force said test contacts against contact pads of an integrated circuit chip to be tested, said method comprising the steps of:

provoiding a rigid pressure plate, positioning a membrane on said substrate with an inner portion of said membrane spanning said opening, and a radially outer portion of said membrane adjacent said substrate, pressing said pressure plate against said membrane and substrate with said membrane between said substrate and pressure plate, causing the pressure of said pressure plate against said membrane to apply radially outwardly directed tension to said membrane, bonding the membrane to said substrate while said pressure plate applies radially outwardly directed tension to said membrane, and removing said pressure plate.

14. The method of claim 13 wherein said step of causing the pressure of said pressure plate to apply radially outwardly directed tension comprises the step of forming an annular groove in said pressure plate and positioning a continuous resilient body in said groove.

15. The method of claim 14 including the step of forming a substrate annular groove in said substrate surrounding said opening and in registration with said first mentioned annular groove.

16. The method of claim 15 including the steps of forming said continuous body as a toroidal body with a thickness substantially equal to the sum of the depths of said substrate annular groove and said first mentioned annular groove.

17. The method of claim 14 wherein said body is an O-ring and wherein said groove has an inner wall and a width greater than the thickness of said O-ring, said step of positioning comprising positioning said O-ring in said groove against said inner wall.

18. A method of forming a membrane test probe for the testing of integrated circuit chips comprising the steps of:

forming a substrate having a central aperture and an annular groove circumscribing the aperture, positioning a thin flexible membrane against the substrate to extend completely across the aperture and across said groove, applying an adhesive coating to a surface of the membrane between the membrane and the substrate, temporarily securing portions of the membrane radially outwardly of the groove to radially outer portions of the substrate, applying a radially outwardly directed tensioning force to said membrane, curing said adhesive coating while applying said radially outwardly directed tensioning force to permanently secure said membrane to said substrate in radially outwardly tensioned condition, and removing said radially outwardly directed tensioning force.

* * * * *